United States Patent
Griffel et al.

(10) Patent No.: US 7,486,511 B1
(45) Date of Patent: Feb. 3, 2009

(54) PASSIVE REAR DOOR FOR CONTROLLED HOT AIR EXHAUST

(75) Inventors: Marc Griffel, Hildrizhausen (DE); Jacques Hummel, Sindelfingen (DE); Michael Schaefer, Pliezhausen (DE); Karl H. Uhl, Weil im Schonbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/132,990

(22) Filed: Jun. 4, 2008

(51) Int. Cl.
*H05K 7/20* (2006.01)
*F25D 17/08* (2006.01)

(52) U.S. Cl. .................. 361/687; 361/690; 361/694; 361/695; 454/184

(58) Field of Classification Search ............ 361/687, 361/690, 695, 694; 454/184, 64; 312/223.1, 312/223.2, 223.3; 165/80.3; 62/89, 259.2
See application file for complete search history.

(56) References Cited

U.S. PATENT DOCUMENTS

| | | | |
|---|---|---|---|
| 5,216,579 A * | 6/1993 | Basara et al. ............ 361/683 |
| 6,412,292 B2 * | 7/2002 | Spinazzola et al. ............ 62/89 |
| 6,535,382 B2 * | 3/2003 | Bishop et al. ............ 361/690 |
| 6,557,357 B2 | 5/2003 | Spinazzola et al. |
| 6,722,151 B2 * | 4/2004 | Spinazzola et al. ........ 62/259.2 |
| 6,817,199 B2 * | 11/2004 | Patel et al. ............ 62/229 |
| 6,859,366 B2 * | 2/2005 | Fink ............ 361/690 |
| 6,876,549 B2 * | 4/2005 | Beitelmal et al. ........... 361/692 |
| 6,927,975 B2 * | 8/2005 | Crippen et al. ............. 361/687 |
| 7,154,748 B2 * | 12/2006 | Yamada ............ 361/690 |
| 7,227,751 B2 * | 6/2007 | Robbins et al. ............ 361/695 |
| 7,259,961 B2 | 8/2007 | Lucero et al. |
| 7,349,209 B2 * | 3/2008 | Campbell et al. ........... 361/694 |
| 7,403,385 B2 * | 7/2008 | Boone et al. ............. 361/692 |

FOREIGN PATENT DOCUMENTS

| | | |
|---|---|---|
| EP | 1727411 | 11/2006 |
| WO | WO 2007054578 A1 * | 5/2007 |

* cited by examiner

*Primary Examiner*—Anatoly Vortman
(74) *Attorney, Agent, or Firm*—Oppenheimer Wolff & Donnelly LLP; Adam P. Kiedrowski

(57) ABSTRACT

A server rack system comprises a server rack, a raised floor cooling system, and an exhaust system. The server rack includes a base, a front side, a rear side, and an interior portion including first, second, and third server rows. The raised floor cooling system includes a floor surface, ductwork disposed below the floor surface, a blower unit, and a vent. The exhaust system is coupled to the rear side of the server rack and includes a top portion, a bottom portion, and first, second, and third adjustable exhaust channels. In particular, the first adjustable exhaust channel has a first adjustable width, an exhaust inlet aligned with the first server row, and an exhaust outlet at the top portion of the server rack; the second adjustable exhaust channel has a second adjustable width, an exhaust inlet aligned with the second server row, and an exhaust outlet at the top portion of the server rack; and the third adjustable exhaust channel has a third adjustable width, an exhaust inlet aligned with the third server row, and an exhaust outlet at the top portion of the server rack. The first and second adjustable exhaust channels are separated by a first moveable guide plate, and the second and third adjustable exhaust channels are separated by a second moveable guide plate. The first and second moveable guide plates are adjustable in order to vary the first, second, and third adjustable widths of the respective exhaust channels based upon an amount of hot air that must be exhausted through each channel.

1 Claim, 5 Drawing Sheets

US 7,486,511 B1

PASSIVE REAR DOOR FOR CONTROLLED HOT AIR EXHAUST

FIELD OF THE INVENTION

The present invention relates in general to heat management, and more particularly, to a system and method for controlled hot air exhaust from the rear door of a server rack.

BACKGROUND OF THE INVENTION

The increased computing power of today's computer systems leads to a proportionately increased energy requirement. Thus, reducing the total amount of energy for a computing center is an important issue in the design and layout of the computing center. Typical server rack rear doors are structured to blow the hot exhaust air horizontally into the room, leading to degraded total energy efficiency for cooling. One possibility of reducing energy includes minimizing the mixing of cold supply air and hot exhaust air within the computing center. For example, there are rear doors which are designed to actively move the hot air from the server rack into a specific direction. However, these rear doors utilize fans to move the hot air, which add to the total energy requirement for the computing center.

FIG. 1 is a diagram illustrating a top view of a typical arrangement of server racks 10 in a computing center. As illustrated in FIG. 1, the computing center includes a first row of server racks 11, a second row of server racks 12, and a third row of server racks 14. In particular, first row of server racks 11 includes first server rack 15A, second server rack 15B, and third server rack 15C; second row of server racks 12 includes first server rack 16A and third server rack 16C; and finally, third row of server racks 14 includes first server rack 17A, second server rack 17B, and third server rack 17C. Each server rack in the rows is orientated such that the cold inlet air used to cool the server racks and the hot outlet air created from the cooling of the server racks is blown in the same direction. This set-up creates cold aisles 18 and 19 and a hot aisle 20 between the various server rack rows. However, one common drawback to this set-up becomes apparent once one or more of the racks is removed from the computing center. When, as illustrated in FIG. 1, the second server rack is removed from second row 12, a gap is created in the row which allows the hot air from hot aisle 20 to flow through and finally mix up with cold air in cold aisle 19 prior to being blown through third row of server racks 14 in order to cool the server racks therein. The mixing of air from both the hot and cold aisles causes a net decrease in the energy coefficient for total cooling, which could therefore lead to a cooling problem for third row 14 in general, and particularly for second server rack 17B in third row 14.

Based on the foregoing, there exists a need for an improved system and method for controlling the hot air exhaust from a server rack in order to increase the total energy coefficient for cooling while substantially avoiding any mixing of cold supply air and hot exhaust air.

BRIEF SUMMARY OF THE INVENTION

The present invention solves the foregoing problems by providing a server rack system comprising a server rack, a raised floor cooling system, and an exhaust system. The server rack includes a base, a front side, a rear side, and an interior portion between the front side and the rear side, the interior portion of the server rack including a first server row housing a first server, a second server row housing a second server, and a third server row housing a third server. The raised floor cooling system includes a floor surface, ductwork disposed below the floor surface, a blower unit, and a vent, wherein the base of the server rack is positioned on the floor surface such that the front side of the server rack is adjacent the vent to enable cold air to be blown from the ductwork through the vent and toward the front side of the server rack. The exhaust system is coupled to the rear side of the server rack and includes a top portion, a bottom portion, and a plurality of adjustable exhaust channels. In particular, the exhaust system includes a first adjustable exhaust channel having a first adjustable width, an exhaust inlet aligned with the first server within the server rack, and an exhaust outlet at the top portion of the server rack; a second adjustable exhaust channel having a second adjustable width, an exhaust inlet aligned with the second server in the server rack, and an exhaust outlet at the top portion of the server rack; and a third adjustable exhaust channel having a third adjustable width, an exhaust inlet aligned with the third server in the server rack, and an exhaust outlet at the top portion of the server rack. Each of the exhaust inlets is in a plane that is substantially perpendicular to a plane containing the exhaust outlets. Furthermore, the first and second adjustable exhaust channels are separated by a first moveable guide plate, and the second and third adjustable exhaust channels are separated by a second moveable guide plate. The first and second moveable guide plates are adjustable in order to vary the first, second, and third adjustable widths of the respective exhaust channels based upon an amount of hot air that must be exhausted through each channel.

DETAILED DESCRIPTION OF THE INVENTION

The present invention will be described in detail with reference to the figures below. However, generally speaking, the present invention encompasses a system and method for controlling the cooling air flow through a server rack. In particular, the present invention involves controlling the direction of hot air exiting a server rack with a configurable air exhaust system. In one exemplary embodiment, the hot air may be directed from the server rack toward air condition inlets in the ceiling of the computing center.

In accordance with various aspects of the present invention, the hot air exiting the server rack may be controlled so as to increase the total energy coefficient for cooling while simultaneously avoiding any mixing of the cold supply air and the hot exhaust air. The energy coefficient for cooling may generally be defined as the amount of cooling work divided by the amount of energy required to perform the cooling operation. As those skilled in the art will appreciate, high values of the energy coefficient represent high efficiency, while low values of the energy coefficient represent low efficiency.

The benefits of the present invention may be achieved without expending additional energy and without the need for additional fans in order to move the exhaust air out of the server rack and toward the air condition inlets. Additionally, the width of each outlet channel in the exhaust system may be adjusted in order to achieve optimal control over the hot air exhaust from the server rack. The width of each channel may be determined based on, for example, the particular type of server in a specific rack position and the typical amount of heat produced by that server.

Figure 2:
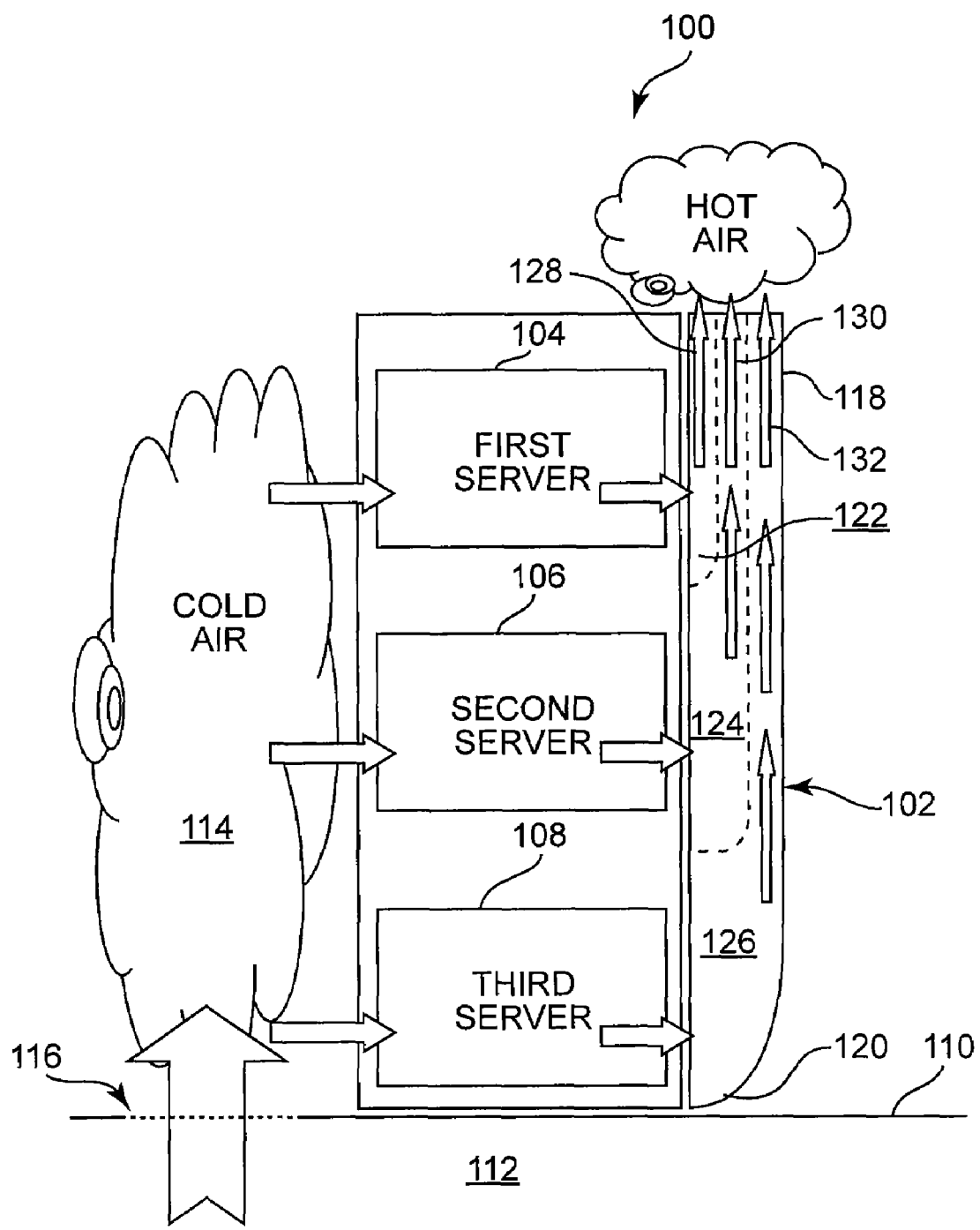
FIG. 2 is a diagram illustrating a cross-sectional view of a server rack having an exhaust system in accordance with the present invention attached thereto.

FIG. 2 is a diagram illustrating a cross-sectional view of a server rack 100 having an exhaust system 102 in accordance with the present invention attached thereto. In particular, rack system 100 includes first server 104, second server 106, and third server 108. Server rack 100 is positioned on raised floor 110, which is positioned above ductwork 112 structured to blow cold air 114 toward the server rack 100 through one or more vents 116. Exhaust system 102 includes top 118, bottom 120, first exhaust channel 122, second exhaust channel 124, and third exhaust channel 126. As illustrated in FIG. 2, first exhaust channel 122 is aligned with the hot air exhaust 128 from first server 104, second exhaust channel 124 is aligned with the hot air exhaust 130 from second server 106, and third exhaust channel 126 is aligned with the hot air exhaust 132 from third server 108. The hot air exhausts 128-132 are directed vertically out of top 118 of exhaust system 102, such as toward one or more air condition inlets in the ceiling of the computing center.

One benefit provided by the attachment of exhaust system 102 to a rear side of server rack 100 is the strategic redirection of hot exhaust air away from adjacent server racks. In particular, hot air is redirected in a way such that the mixing of hot exhaust air with cold air 114 from ductwork 112 is substantially avoided. Thus, the system and method of the present invention involve the passive redirection of hot exhaust air to a location of the computing center where, for example, the air condition inlets are installed. The net effect of this passive redirection is an increase in the total energy coefficient for cooling.

As those skilled in the art will appreciate, server rack 100 and exhaust system 102 have been described as including three servers and three exhaust channels, respectively, merely for purposes of example and not limitation. Thus, exhaust systems in accordance with the present invention may be designed and structured to include any number or exhaust channels without departing from the intended scope of the present invention.

Figure 1:
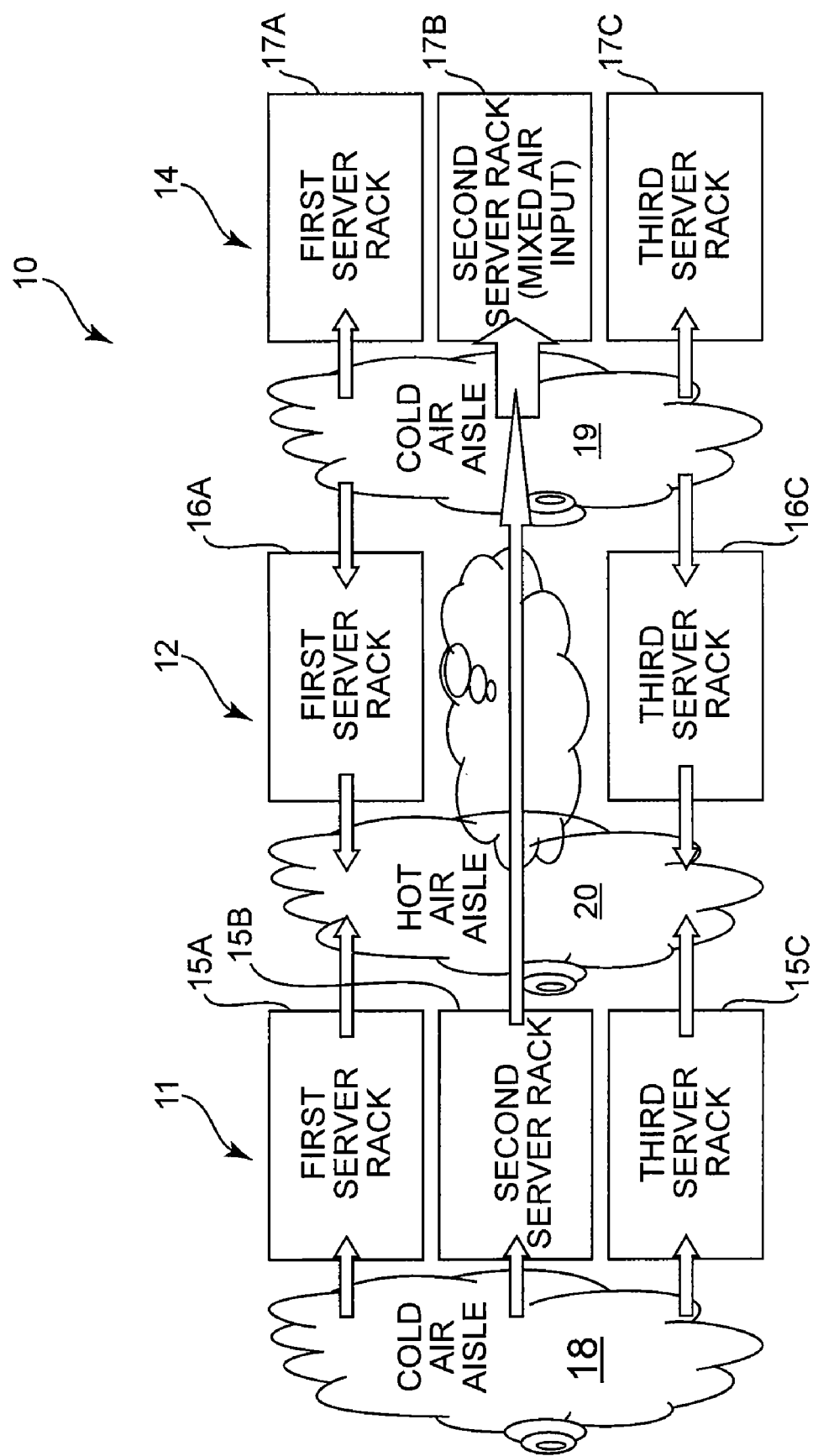
FIG. 1 is a diagram illustrating a top view of a typical arrangement of server racks in a computing center.
Figure 3:
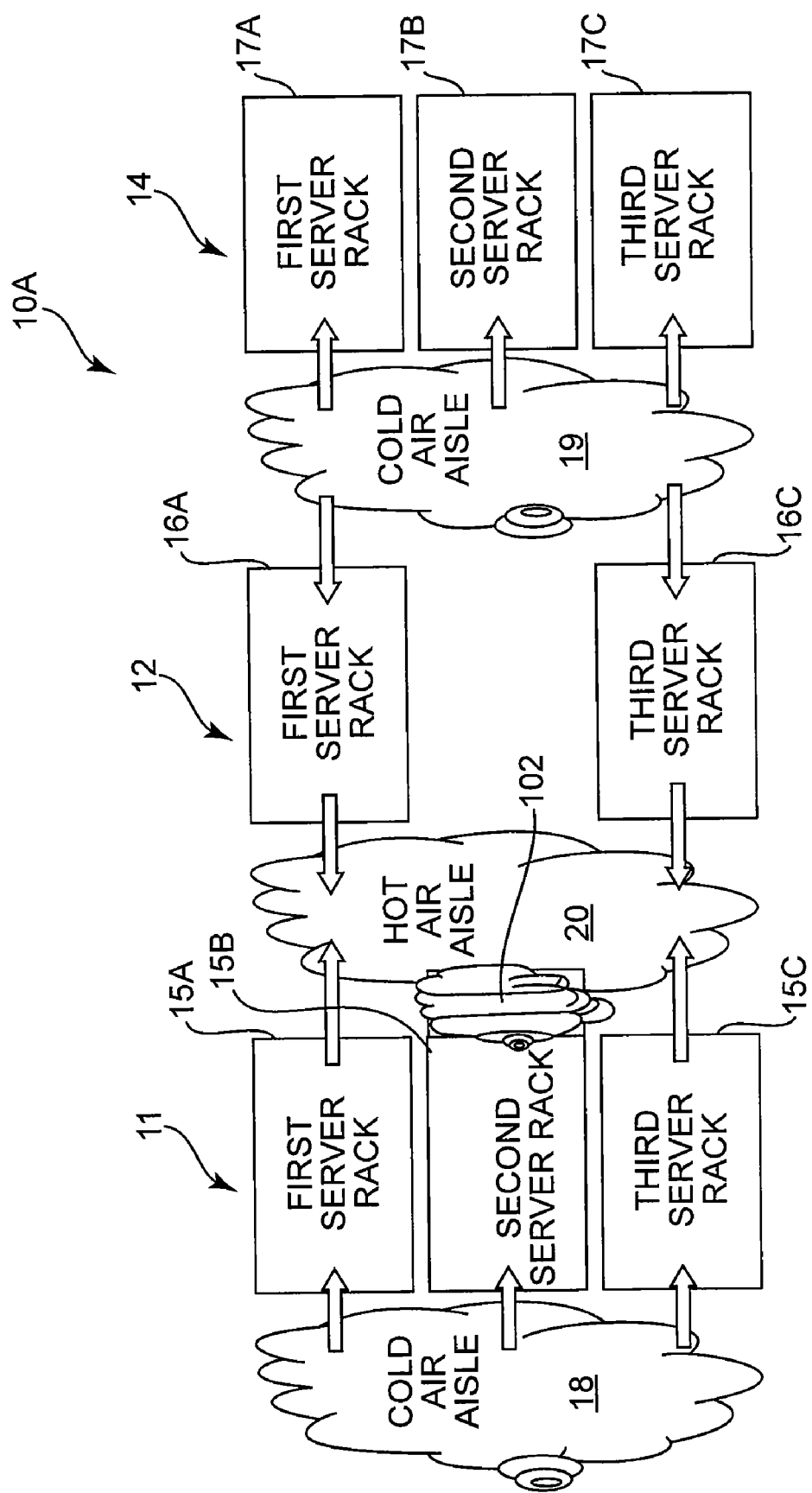
FIG. 3 is a diagram illustrating a top view of an arrangement of server racks in a computing center similar to the arrangement illustrated in FIG. 1, wherein one of the server racks has an exhaust system in accordance with the present invention attached thereto.

FIG. 3 is a diagram illustrating a top view of an arrangement of server racks 10A in a computing center similar to the arrangement of server racks 10 previously illustrated in FIG. 1. However, as illustrated in FIG. 3, an exhaust system 102 similar to the one previously described in reference to FIG. 2 has been coupled to a rear side of second server rack 15B in first row of server racks 11. Without exhaust system 102 coupled to second server rack 15B, the gap created in second row of server racks 12 would otherwise allow the hot air from hot aisle 20 to flow through and mix with the cold air in cold aisle 19 as previously described with reference to FIG. 1, thereby causing a decrease in the energy coefficient for total cooling. Instead, the presence of exhaust system 102 results in a decrease in the amount of energy required for cooling because the mixing of the cold supply air with the hot exhaust air near second server rack 17B of third row 14 is no longer an issue. As a result, there is an increase in the energy coefficient for total cooling.

Although the arrangement of server racks in FIG. 3 illustrates an exhaust system in accordance with the present invention being utilized only on a server rack being positioned adjacent to a gap in a server rack row, workers skilled in the art will appreciate that other configurations are also possible. In particular, exhaust systems in accordance with the present invention may be utilized on any server rack regardless of whether it is positioned adjacent to a gap in a server rack row. For example, embodiments of a server rack arrangement wherein every server rack is outfitted with an exhaust system for redirecting hot exhaust air vertically are contemplated and within the intended scope of the present invention.

Figure 4:
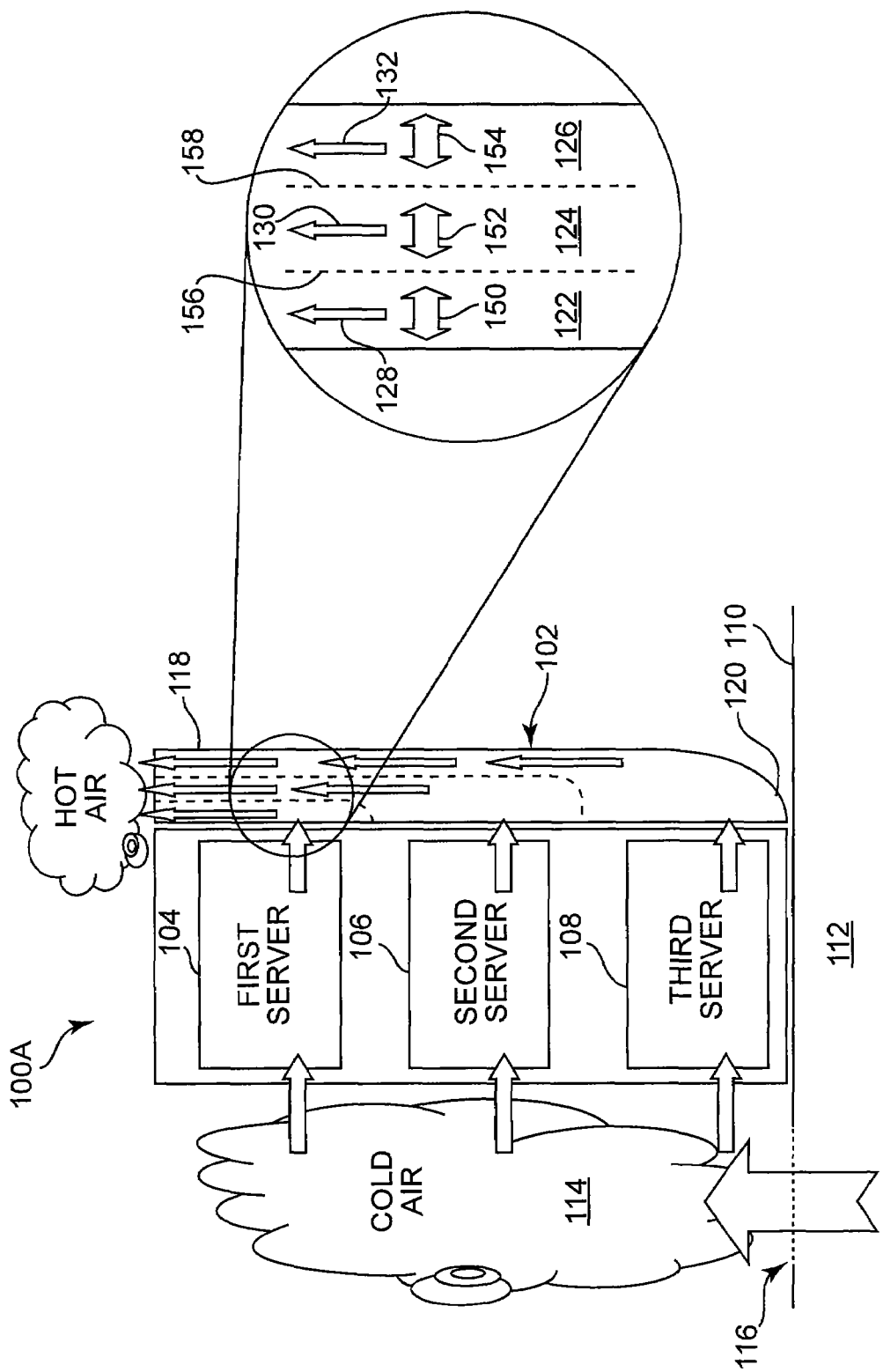
FIG. 4 is a diagram illustrating a cross-sectional view of an alternative exhaust system in accordance with the present invention having a plurality of adjustable exhaust channels.

FIG. 4 is a diagram illustrating a cross-sectional view of a server rack 100A having an alternative exhaust system 102A in accordance with the present invention attached thereto. In particular, exhaust system 102A is similar to exhaust system 102 previously described in reference to FIG. 2. However, exhaust system 102A includes first exhaust channel 122A, second exhaust channel 124A, and third exhaust channel 126A having adjustable widths 150, 152, and 154, respectively. The adjustable widths 150, 152, and 154 are possible due to a pair of moveable guide plates separating the exhaust channels. In particular, a first moveable guide plate 156 separates first exhaust channel 122A from second exhaust channel 124A, while a second moveable guide plate 158 separates second exhaust channel 124A from third exhaust channel 126A. The position of first and second guide plates 156 and 158 may be adjusted via any suitable means. In one embodiment, first and second guide plates 156 and 158 are manually adjusted. In another embodiment, first and second guide plates 156 and 158 are coupled to a motorized device for automatically adjusting their positions.

An exhaust system having exhaust channels with adjustable widths allows the exhaust system to be specifically tailored to a particular server rack setup. For example, when all of the servers in a rack are identical, they may all produce approximately the same amount of heat, and therefore, require a similar flow of air into and out of the various levels of the server rack. In such an embodiment, the exhaust channels may preferably be designed with a similar exhaust channel width, as illustrated in FIG. 4, such that each exhaust channel utilizes ⅓ of the total exhaust capacity of the exhaust system. However, in other server rack embodiments wherein several different types of servers having different cooling needs are positioned within the server rack, it may be beneficial to adjust the exhaust channel width of each channel such that the width of each exhaust channel is proportional to the amount of heat produced by the corresponding server. This may also be true when the server rack includes a plurality of servers that are all substantially similar, but that may be running at different levels and thus have different cooling needs.

Figure 5A:
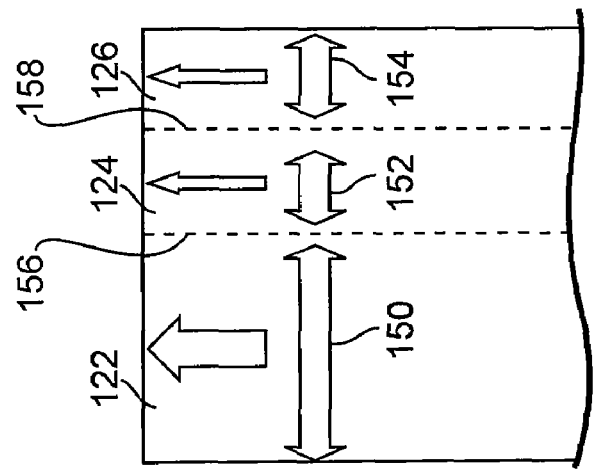
FIGS. 5A-5C are diagrams illustrating the adjustability of the exhaust channels within the exhaust system in accordance with the present invention.
Figure 5B:
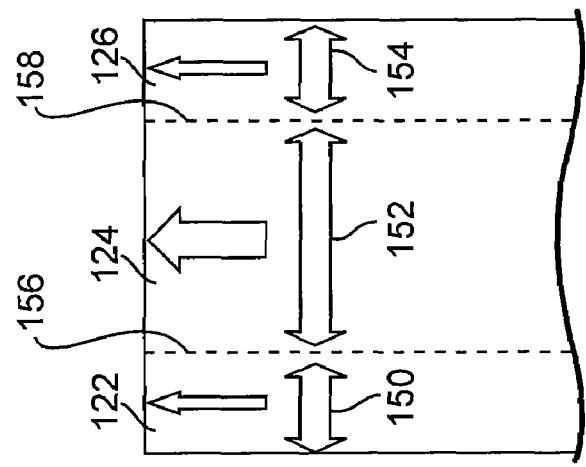
Figure 5C:
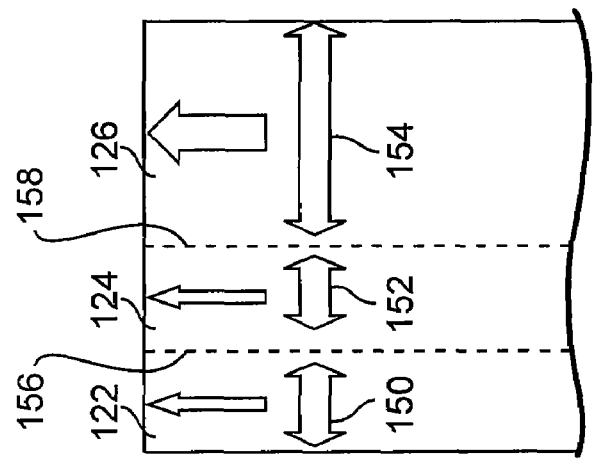

FIGS. 5A-5C are diagrams illustrating various configurations of first and second moveable guide plates 156 and 158 of exhaust system 102A that give "preference" to a specific zone of a server rack. This allows customization of the exhaust system based upon the particular exhaust needs of each of the servers in the rack . In particular, FIG. 5A illustrates a first example wherein the width 150 of first exhaust channel 122A is increased while the widths 152 and 154 of second and third exhaust channels 124A and 126A, respectively, are decreased. As will be appreciated by those skilled in the art, the maximum and minimum width for a particular channel may be determined based on the dimensions of the exhaust system. In one embodiment, first and second moveable guide plates 156 and 158 may be adjusted such that one or two out of the three exhaust channels are completely closed (i.e., have a width of about zero). Closing off an exhaust channel may be beneficial when, for example, a server in the server rack is either powered off or removed from the rack, thus eliminating any need for cooling that particular server. FIG. 5B illustrates a second example wherein the width 152 of second exhaust channel 124A is increased while the widths 150 and 154 of first and third exhaust channels 122A and 126A, respectively, are decreased. Finally, FIG. 5C illustrates a third example wherein the width 154 of third exhaust channel 126A is increased while the widths 150 and 152 of first and second exhaust channels 122A and 124A, respectively, are decreased. Based on the foregoing, workers skilled in the art will appreciate that numerous other variations of channel widths are also contemplated and within the intended scope of the present invention.

Although the present invention has been described with reference to preferred embodiments, workers skilled in the art will recognize that changes may be made in form and detail without departing from the spirit and scope of the invention.

What is claimed is:

1. A server rack system comprising:
   a server rack having a base, a front side, a rear side, and an interior portion between the front side and the rear side, the interior portion of the server rack including a first server row housing a first server, a second server row housing a second server, and a third server row housing a third server;
   a raised floor cooling system including a floor surface, ductwork disposed below the floor surface, a blower unit, and a vent, wherein the base of the server rack is positioned on the floor surface such that the front side of the server rack is adjacent the vent to enable cold air to be blown from the ductwork through the vent and toward the front side of the server rack;
   an exhaust system coupled to the rear side of the server rack and having a top portion, a bottom portion, and a plurality of adjustable exhaust channels including:
   a first adjustable exhaust channel having a first adjustable width, an exhaust inlet aligned with the first server row, and an exhaust outlet at the top portion of the server rack;
   a second adjustable exhaust channel having a second adjustable width, an exhaust inlet aligned with the second server row, and an exhaust outlet at the top portion of the server rack; and
   a third adjustable exhaust channel having a third adjustable width, an exhaust inlet aligned with the third server row, and an exhaust outlet at the top portion of the server rack;
   each of the exhaust inlets being in a plane that is substantially perpendicular to a plane containing the exhaust outlets;
   wherein the first and second adjustable exhaust channels are separated by a first moveable guide plate and wherein the second and third adjustable exhaust channels are separated by a second moveable guide plate, the first and second moveable guide plates being adjustable in order to vary the first, second, and third adjustable widths of the respective exhaust channels based upon an amount of hot air that must be exhausted through each channel.

* * * * *